US007129125B2

(12) United States Patent
Sekine et al.

(10) Patent No.: US 7,129,125 B2
(45) Date of Patent: Oct. 31, 2006

(54) SEMICONDUCTOR DEVICE AND MANUFACTURING METHOD THEREOF INCLUDING HEATING A SILICON OXIDE IN A HELIUM GAS

(75) Inventors: Katsuyuki Sekine, Yokohama (JP); Seiji Inumiya, Yokohama (JP); Ichiro Mizushima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 140 days.

(21) Appl. No.: 10/785,074

(22) Filed: Feb. 25, 2004

(65) Prior Publication Data

US 2004/0195636 A1    Oct. 7, 2004

(30) Foreign Application Priority Data

Feb. 26, 2003    (JP)    ............................. 2003-049611

(51) Int. Cl.
*H01L 21/336*    (2006.01)
*H01L 21/8234*    (2006.01)
*H01L 21/44*    (2006.01)
*H01L 21/31*    (2006.01)
*H01L 21/469*    (2006.01)

(52) U.S. Cl. ...................... 438/197; 438/287; 438/597; 438/786; 438/788

(58) Field of Classification Search ................ 438/197, 438/287, 591, 786, 788
See application file for complete search history.

(56) References Cited

U.S. PATENT DOCUMENTS 6,649,538 B1 *    11/2003    Cheng et al.    ................ 438/775

6,800,519 B1 *    10/2004    Muraoka et al.    ............ 438/216

FOREIGN PATENT DOCUMENTS

| JP | 6-69198 | 3/1994 |
|---|---|---|
| JP | 10-209449 | 8/1998 |
| JP | 2002-222941 | 8/2002 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 242-61.*
Yasuda, Y. et al., "Radical Nitridation in Multi-Oxide Process for 100nm Generation CMOS Technology", 2001 Symposium on VLSI Technology Digest of Technical Papers, 2 pages, (2001).
Chen, C. H. et al., "Downscaling Limit of Equivalent Oxide Thickness in Formation of Ultrathin Gate Dielectric by Thermal-Enhanced Remote Plasma Nitridation", IEEE Transactions on Electron Devices, vol. 49, No. 5, pp. 840-846, (May 2002).
Notification of Reasons for Rejection in Japanese Patent App. No. 2003-49611, mailed Jan. 31, 2006 (4 pages).

* cited by examiner

*Primary Examiner*—William M. Brewster
(74) *Attorney, Agent, or Firm*—Finnegan, Henderson, Farabow, Garrett & Dunner, L.L.P.

(57) ABSTRACT

A semiconductor device comprises a semiconductor region including silicon, and an insulating film including silicon, oxygen, nitrogen, and helium, the dielectric film provided on the semiconductor region, and the dielectric film having a concentration distribution with respect to a film thickness direction, the concentration distribution having a maximal value of concentration of the helium in a surface portion on the semiconductor region side and a maximal value of concentration of the nitrogen in a surface portion on a side opposite to the semiconductor region.

5 Claims, 5 Drawing Sheets

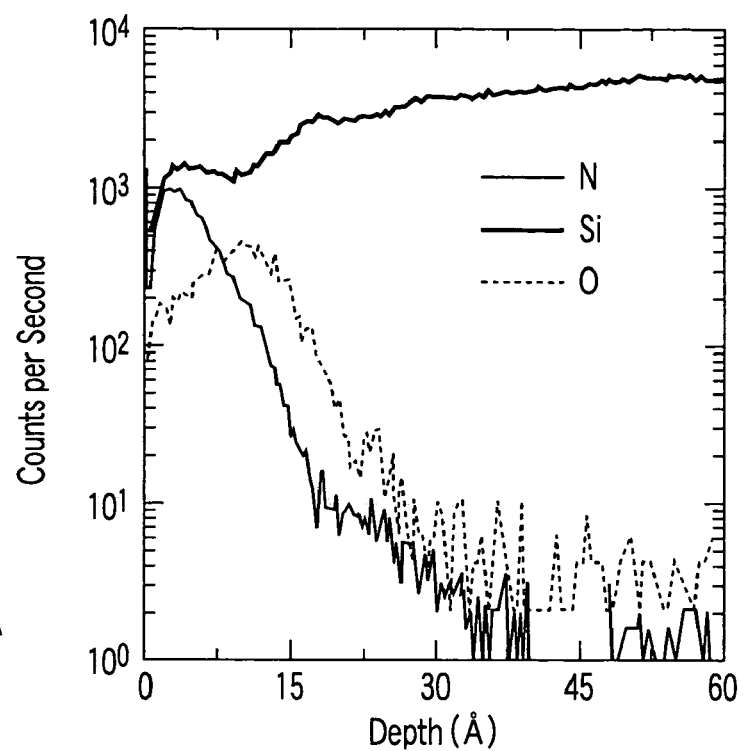
F I G. 2A
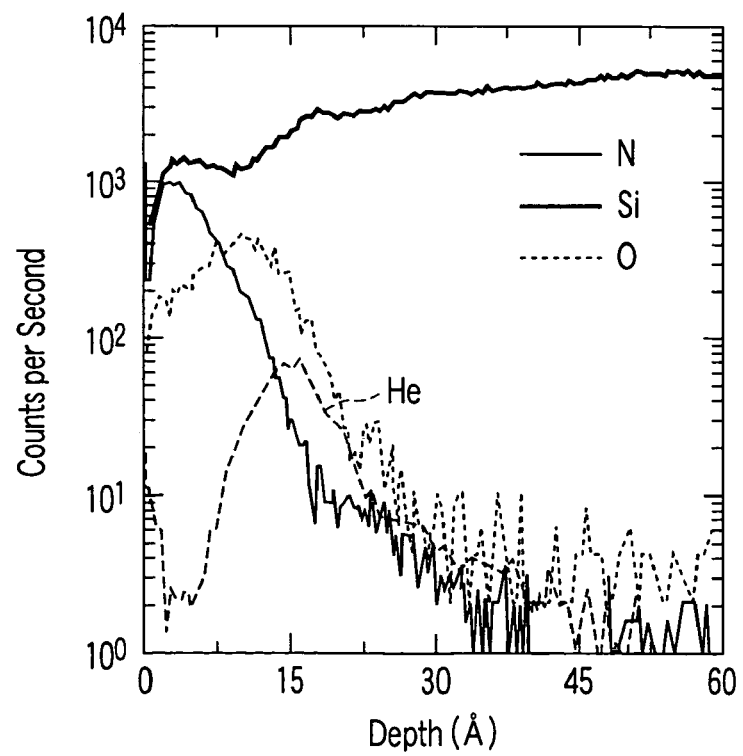
F I G. 2B

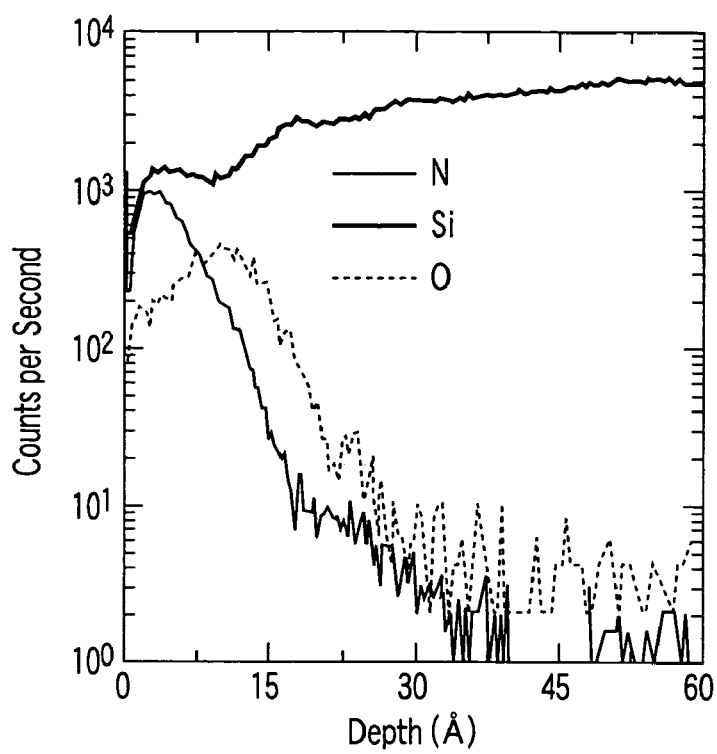
F I G. 6A
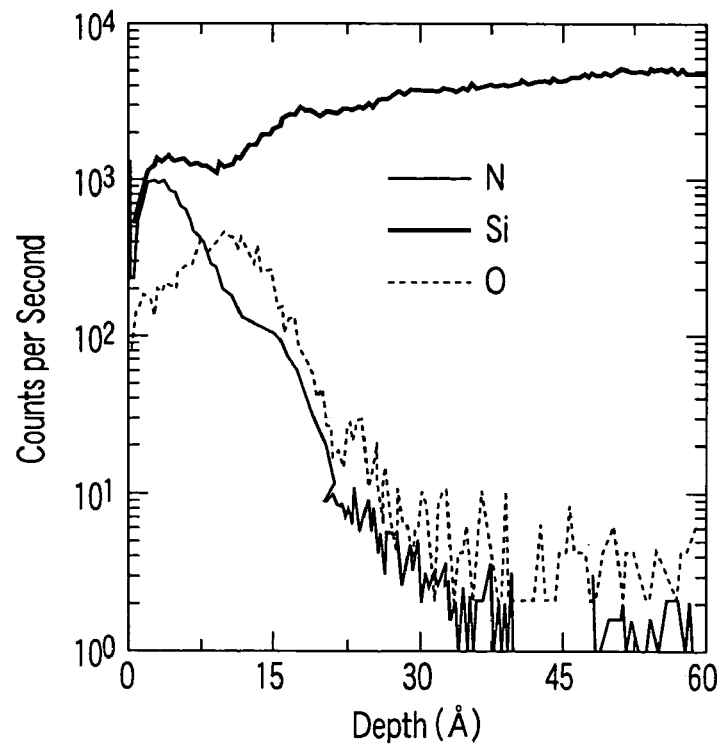
F I G. 6B

SEMICONDUCTOR DEVICE AND MANUFACTURING METHOD THEREOF INCLUDING HEATING A SILICON OXIDE IN A HELIUM GAS

CROSS-REFERENCE TO RELATED APPLICATIONS

This application is based upon and claims the benefit of priority from the prior Japanese Patent Application No. 2003-049611, filed Feb. 26, 2003, the entire contents of which are incorporated herein by reference.

BACKGROUND OF THE INVENTION

1. Field of the Invention

The present invention relates to a semiconductor device and manufacturing method, particularly to a semiconductor device including a thin dielectric film such as a gate dielectric film or capacitor dielectric film, and a manufacturing method of the device.

2. Description of the Related Art

In a semiconductor field such as LSI, miniaturization of a semiconductor device has heretofore been proceeded, but it has gradually become difficult to miniaturize the device. In an example of a MOS transistor, for instance, it has been increasingly difficult to reduce a gate leakage current and to decrease a physical film thickness of a gate dielectrics film.

To solve the problem, the use of a dielectric film having a higher permittivity than that of a silicon oxide film as a gate a dielectric film has been studied in order to inhibit increase of the gate leakage current involving the reduction of the physical film thickness of the gate dielectric film. As this type of the dielectric film, a dielectric film including silicon, oxygen, and nitrogen (hereinafter referred to as an SiON film) has been known.

A conventional process of the SiON film is as follows. First, the ultra-thin silicon oxide film (base oxide film) which is to be the SiON film is formed on a silicon substrate by thermal oxidation. Thereafter, the base oxide film is nitrided by plasma such as $N_2$ plasma (nitrogen radical, nitrogen ion) to form the SiON film (e.g., see 2001 Symposium on VLSI Technology Digest of Technical Papers).

However, this type of conventional process of the SiON film has the following problem.

When the film thickness of the base oxide film is 2.5 nm or less, particularly 1.4 nm or less, at a nitriding time of the base oxide film by a nitrogen radical, and the like, oxygen replaced with nitrogen reaches an interface between the silicon substrate and base oxide film, the oxygen oxidizes the silicon substrate, and the physical film thickness of the SiON film increases. In other words, it is difficult to reduce the electrical film thickness of the SiON film.

Therefore, in the conventional process of the SiON film, even if the base oxide film is thinned, it is difficult to obtain an SiON film which has a desired small film thickness. This inhibits the miniaturization of the MOS transistor.

BRIEF SUMMARY OF THE INVENTION

A semiconductor device according to an aspect of the present invention comprises a semiconductor region including silicon; and a dielectric film including silicon, oxygen, nitrogen, and helium, the dielectric film provided on the semiconductor region, and the dielectric film having a concentration distribution with respect to a film thickness direction, the concentration distribution having a maximal value of concentration of the helium in a surface portion on the semiconductor region side and a maximal value of concentration of the nitrogen in a surface portion on a side opposite to the semiconductor region.

A semiconductor device according to another aspect of the present invention comprises a semiconductor region including silicon; and a dielectric film including silicon, oxygen, and nitrogen, the dielectric film provided on the semiconductor region, and the dielectric film having a concentration distribution with respect to a film thickness direction, the concentration distribution having first maximal value of concentration of the nitrogen in a surface portion on the semiconductor region side and second maximal value of concentration of the nitrogen in a surface portion on a side opposite to the semiconductor region.

A method of manufacturing a semiconductor device according to an aspect of the present invention comprises forming a silicon oxide film on a semiconductor region including silicon; heating the semiconductor region and silicon oxide film in a helium gas atmosphere; and forming a dielectric film including silicon, oxygen, nitrogen, and helium by nitriding the silicon oxide film.

A method of manufacturing a semiconductor device according to another aspect of the present invention comprises forming a silicon oxide film on a semiconductor region including silicon; and forming a dielectric film including silicon, oxygen, and nitrogen by nitriding the silicon oxide film and changing a film forming condition at least once in the course of formation of the dielectric film.

BRIEF DESCRIPTION OF THE SEVERAL VIEWS OF THE DRAWING

FIGS. 2A and 2B are diagrams showing a concentration distribution of each element in a depth direction of an SiON film in the MOS capacitors according to a comparative example and first embodiment;

FIGS. 6A and 6B are diagrams showing the research result of the concentration distribution of each element in the depth direction of the SiON film in the MOS capacitors according to the comparative example and third embodiment.

DETAILED DESCRIPTION OF THE INVENTION

Embodiments of the present invention will be described hereinafter with reference to the drawings.

(First Embodiment)

FIGS. 1A to 1D are sectional views showing a manufacturing process of a MOS capacitor according to a first embodiment of the present invention.

Figure 1A:
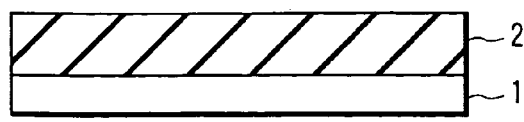
FIGS. 1A to 1D are sectional views showing a manufacturing process of a MOS capacitor according to a first embodiment of the present invention.

First, as shown in FIG. 1A, the process comprises exposing a silicon substrate 1 to an oxidizing atmosphere of 900 to 1000° C.; and forming a thin silicon oxide film (base oxide film) 2 having a thickness of about 1.2 to 1.4 nm on the surface of the silicon substrate 1.

Figure 1C:
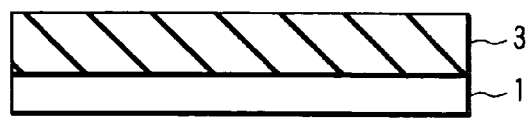
Figure 1B:
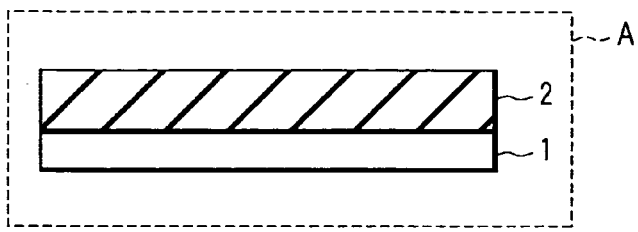
Figure 1D:
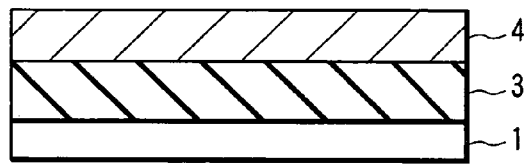

Next, the process comprises laying the silicon substrate 1, on which the base oxide film 2 is formed, on a substrate holding electrode which includes a heating mechanism in a vacuum chamber; setting the substrate holding electrode at a temperature of 400° C.; introducing He gas into the vacuum chamber; and setting the pressure of the He gas in the vacuum chamber to a range of 1 to 10 Torr. As a consequence, as shown in FIG. 1B, the silicon substrate 1 and base oxide film 2 are heated in He gas atmosphere A. Accordingly, a pile-up of He is formed in an interface portion between the silicon substrate 1 and base oxide film 2. In FIGS. 1B to 1D, the pile-up of He is shown by bold lines.

Next, the process comprises introducing a mixture gas of a rare(inert) gas and nitrogen ($N_2$) into the vacuum chamber; generating microwaves of 2.45 GHz; and generating a nitrogen plasma (nitrogen ion, nitrogen radical) using the microwaves. As a consequence, as shown in FIG. 1C, the silicon oxide film 2 is nitrided by the nitrogen plasma, and an SiON film 3 as a capacitor insulating dielectric film is formed.

Thereafter, as shown in FIG. 1D, a polycrystalline silicon film 4 including phosphor at a high concentration as a capacitor electrode is formed on the SiON film 3, and a MOS capacitor is obtained.

The present inventors researched the concentration distribution of silicon, oxygen, nitrogen, and He in a depth direction of the SiON film 3 of the MOS capacitor according to the present embodiment. As a comparative example, the inventors also researched the concentration distribution of silicon, oxygen, and nitrogen in the depth direction of the SiON film of the MOS capacitor formed by a conventional method. The conventional method is a such method that the heating treatment in the He gas atmosphere A is omitted from the method of the present embodiment.

FIGS. 2A and 2B show research results of the concentration distribution of each element in the depth direction of the SiON film in the MOS capacitors according to the comparative example and first embodiment. The concentration of each element in the SiON film was measured by SIMS.

It is seen from FIG. 2B that in the MOS capacitor of the present embodiment, He is unevenly distributed in an interface portion between the silicon substrate and SiON film, and a maximal value of He exists in the surface portion of the SiON film on a silicon substrate side. Furthermore, it is seen that the maximal value of the nitrogen concentration exists in the surface portion of the SiON film on a side opposite to the silicon substrate. Additionally, it is seen from FIG. 2A that the concentration distribution is not seen in the SiON film of conventional MOS capacitor.

Figure 3:
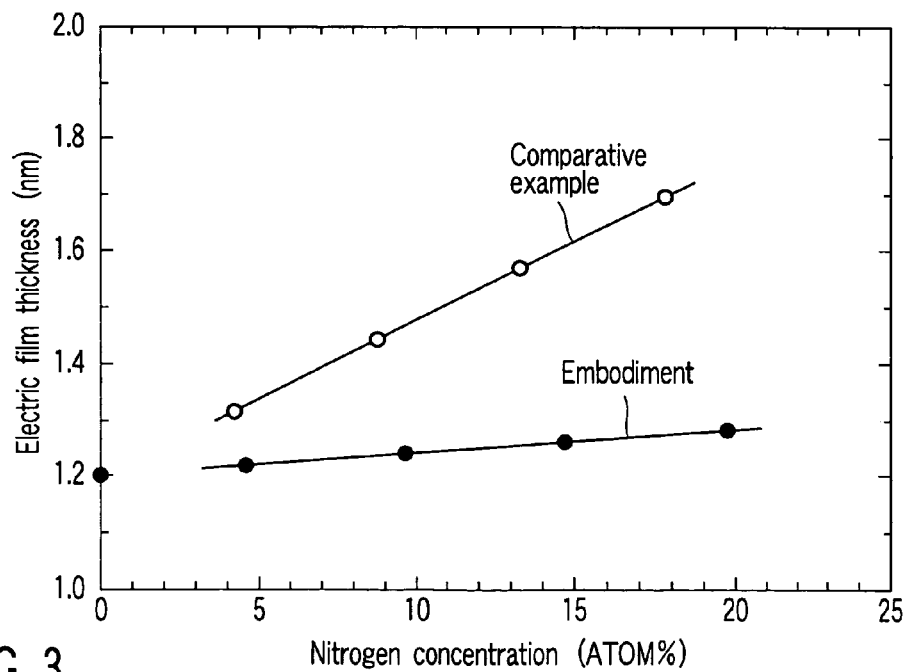
FIG. 3 is a diagram showing a research result of a relation between a nitrogen concentration and electrical film thickness in an SiON film with respect to the MOS capacitors of the comparative example and first embodiment.

FIG. 3 shows the research result of a relation between the nitrogen concentration and electric film thickness in the SiON film with respect to the MOS capacitors of the present embodiment and comparative example. The nitrogen concentration in the SiON film was measured using an X-ray photoelectron spectrometer.

As seen from FIG. 3, when the SiON film of the present embodiment is compared with the SiON film of the comparative example with the same nitrogen concentration, the SiON film of the present embodiment has an electrical film thickness smaller than that of the SiON film of the comparative example. Furthermore, it is seen that the SiON film of the present embodiment has a sufficiently small ratio of an increase of the electrical film thickness to that of the nitrogen concentration as compared with the SiON film of the comparative example.

In this way, according to the forming method of the SiON film of the present embodiment, even when the nitrogen concentration in the SiON film is raised, the increase of the electrical film thickness of the SiON film can be effectively inhibited. Moreover, according to the forming method of the SiON film of the present embodiment, even when the nitrogen concentration in the SiON film is raised, it is possible to sufficiently reduce the physical film thickness of the SiON film.

The reason why the following result is obtained is considered as follows. In the present embodiment, the silicon substrate 1 and base oxide film 2 are heated in the He atmosphere before nitriding the base oxide film 2. As a consequence, helium is introduced in the interface portion between the silicon substrate 1 and base oxide film 2, and He is piled up in the interface portion.

The pile-up of He prevents oxidization reaction of silicon in the vicinity of the interface between the silicon substrate 1 and base oxide film 2 when the base oxide film 2 undergoes a nitriding process. The silicon is supplied from the silicon substrate 1.

Accordingly, even when nitrogen is introduced into the base oxide film 2 at the high concentration, the physical film thickness of the SiON film 3 does not easily increase, and it is possible to reduce the electric film thickness of the SiON film 3. That is, the SiON film 3 having the high nitrogen concentration and the small physical and electrical film thicknesses is obtained.

As described above, according to the present embodiment, the nitrogen concentration in the SiON film 3 can be raised without incurring an increase in film thickness of the SiON film 3. It is therefore possible to realize a fine MOS capacitor with a low leakage current.

The present embodiment can variously be modified as follows. For example, in the present embodiment, phosphor was doped into the polycrystalline silicon film 4, but another dopant can also be doped.

In the present embodiment, the polycrystalline silicon film 4 is used as one capacitor electrode, but it is possible to use another semiconductor film or metal film (e.g., noble metal films such as an Ru film). Moreover, as the other capacitor electrode, the silicon substrate 1 is used, but another substrate including silicon, such as an SOI substrate or SiGe substrate, can also be used. Furthermore, instead of the semiconductor substrates such as the silicon substrate 1, a semiconductor layer or metal layer including silicon can also be used.

Moreover, in the present embodiment, $N_2$ is used as the source of nitrogen, but materials including nitrogen such as NO and $N_2O$ can also be used.

In the present embodiment, the film thickness of the base oxide film 2 is set to 1.4 nm or less. However, even at 2.5 nm or less, a similar effect is obtained. Additionally, the effect of the present embodiment becomes pronounced, when the film thickness of the base oxide film 2 is small, especially 1.4 nm or less. The reason is that with the film thickness of 1.4 nm or less of the base oxide film 2, the increase of the physical film thickness of the SiON film 3 is caused by the nitriding of silicon supplied from the silicon substrate 1.

(Second Embodiment)

FIGS. 4A to 4F are sectional views showing a manufacturing process of a MOS transistor according to a second embodiment of the present invention.

Figure 4A:
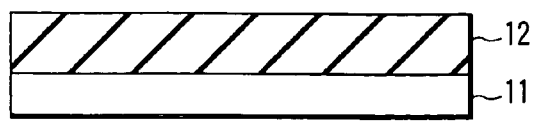
FIGS. 4A to 4F are sectional views showing a manufacturing process of a MOS transistor according to a second embodiment of the present invention.

First, as shown in FIG. 4A, the process comprises exposing a silicon substrate 11 to an oxidizing atmosphere of 900 to 1000° C.; and forming a thin silicon oxide film (base oxide film) 12 to a thickness of about 1.2 to 1.4 nm on the surface of the silicon substrate 11.

Next, the process comprises laying the silicon substrate 11, on which the base oxide film 12 is formed, on a substrate holding electrode which includes the heating mechanism in the vacuum chamber; setting the substrate holding electrode at a temperature of 400° C.; introducing He gas into the vacuum chamber; and setting the pressure of He gas in the vacuum chamber to a range of 1 to 10 Torr. As a consequence, as shown in FIG. 4B, the silicon substrate 11 and base oxide film 12 are heated in the He gas atmosphere A.

As a consequence, He is piled up in the interface portion between the silicon substrate 11 and base oxide film 12. In FIGS. 4B to 4F, the pile-up of He is shown by bold lines.

Next, the process comprises introducing the mixture gas of the rare(inert) gas and nitrogen ($N_2$) into the vacuum chamber; generating microwaves of 2.45 GHz; and generating the nitrogen plasma using the microwaves. Accordingly, as shown in FIG. 4C, the silicon oxide film 12 is nitrided by the nitrogen plasma, and an SiON film 13 which is to be processed into a gate dielectric film is formed.

Figure 4D:
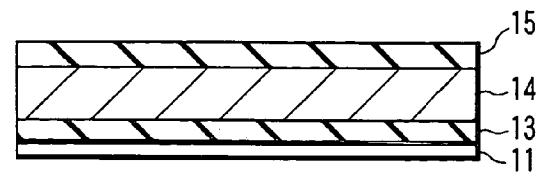
Figure 4B:
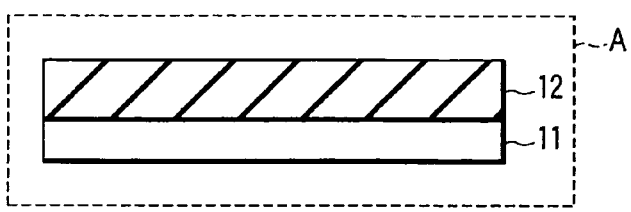

Next, as shown in FIG. 4D, a polycrystalline silicon film 14 including dopant which is to be processed into a gate electrode, and a silicon nitride film 15 as a gate upper dielectric film are successively formed on the SiON film 13.

Next, as shown in FIG. 4, the process comprises processing the silicon nitride film 15, polycrystalline silicon film 14, and SiON film 13 by photolithography and etching to form the gate upper dielectric film 15 comprising the silicon nitride film, gate electrode 14 comprising the polycrystalline silicon film, and gate dielectric film 13 comprising the SiON film.

Figure 4E:
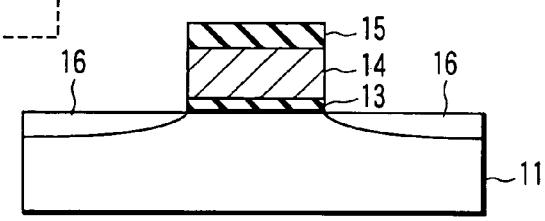
Figure 4C:
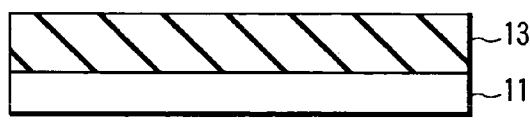

Next, as shown in FIG. 4E, dopant is implanted into the substrate surface by ion implantation method by using the gate upper dielectric film 15 as a mask. Thereafter, annealing is performed to form extensions 16.

Figure 4F:
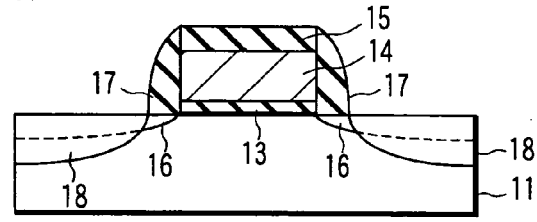

Next, as shown in FIG. 4F, the process comprises forming a gate side wall dielectric film 17 comprising a silicon nitride film; implanting dopant in the substrate surface by ion implantation method using the gate side wall dielectric film 17 and gate upper dielectric film 15 as the mask; and thereafter performing annealing to form a source/drain regions 18.

A research result of the concentration distribution of silicon, nitrogen, oxygen, and He in the SiON film 13 of the MOS capacitor obtained in this manner, it is found out that the concentration distribution is similar to that of the SiON film 3 of the first embodiment. Furthermore, for the same reason as in the first embodiment, the nitrogen concentration in the SiON film 13 can be raised without incurring any increase in film thickness of the SiON film 13. It is therefore possible to realize a fine MOS transistor with a low gate leakage current.

The MOS transistor of the present embodiment can be modified as the MOS transistor of the first embodiment. Moreover, when a metal gate electrode is used as the gate electrode, an application of damascene gate structure further enhances miniaturization of the structure.

(Third Embodiment)

Figure 5A:
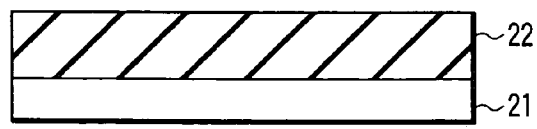
FIGS. 5A to 5C are sectional views showing a manufacturing process of the MOS capacitor according to a third embodiment of the present invention.
Figure 5B:
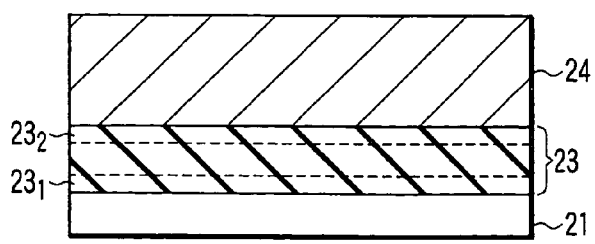
Figure 5C:
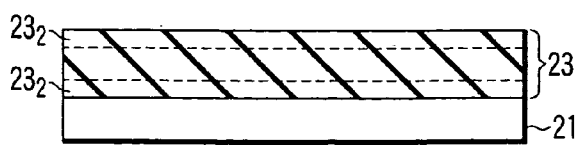

FIGS. 5A to 5C are sectional views showing the manufacturing process of the MOS capacitor according to a third embodiment of the present invention.

First, as shown in FIG. 5A, the process comprises exposing a silicon substrate 21 to the oxidizing atmosphere of 900 to 1000° C.; and forming a thin silicon oxide film (base oxide film) 22 to a thickness of about 1.2 to 1.4 nm on the surface of the silicon substrate 21.

Next, the process comprises laying the silicon substrate 21, on which the base oxide film 22 is formed, on a substrate holding electrode which includes the heating mechanism in the vacuum chamber; setting the substrate holding electrode at a predetermined temperature; introducing the mixture gas of the rare(inert) gas and nitrogen ($N_2$) into the vacuum chamber and generating microwaves of 2.45 GHz; and generating the nitrogen plasma (nitrogen ion, nitrogen radical) by the microwaves. As a consequence, as shown in FIG. 5B, the base oxide film 22 is nitrided by the nitrogen plasma and an SiON film 23 as a capacitor dielectric film is formed.

At this time, during the film forming process of the SiON film 23, the pressure in the vacuum chamber is changed. Concretely, first (in a first period), the pressure in the vacuum chamber is set to a constant low pressure in a range of 10 to 50 mTorr, and kinetic energy of the nitrogen plasma (irradiation energy of the nitrogen ion) is raised. Thereafter (in a second period), the pressure in the vacuum chamber is set to a high pressure of 50 mTorr or more, and the kinetic energy of the nitrogen plasma (irradiation energy of the nitrogen ion) is lowered.

By changing the pressure at the time of forming the SiON film 23 (kinetic energy of the nitrogen plasma (irradiation energy of the nitrogen ion)) in this manner, the nitrogen concentration distribution in the film thickness direction of the SiON film 23 has two maximal values.

Concretely, the SiON film 23 includes a first nitrided region $23_1$ indicating the maximal value of a first nitrogen concentration in a surface portion on a side in contact with the silicon substrate 21, and a second nitrided region $23_2$ indicating the maximal value of a second nitrogen concentration in the surface portion on a side opposite to the silicon substrate 21. The first nitrided region $23_1$ is formed mainly in the first period, and the second nitrided region $23_2$ is formed mainly in the second period.

The maximal value of the first nitrogen concentration is preferably smaller than that of the second nitrogen concentration. The reason is that element characteristics are deteriorated owing to an excessively high nitrogen concentration in the vicinity of the interface between the silicon substrate 21 and SiON film 23.

Thereafter, as shown in FIG. 5C, a polycrystalline silicon film 24 including phosphor at the high concentration as a capacitor electrode is formed on the SiON film 23, and the MOS capacitor is obtained.

The present inventors researched the concentration distribution of silicon, oxygen, and nitrogen in the depth direction of the SiON film 23 of the MOS capacitor according to the present embodiment. As a comparative example, the inventors also researched the concentration distribution of nitrogen, oxygen, silicon, and He in the depth direction of the SiON film of the MOS capacitor formed by a conventional method. The conventional method is the same as the method of the present embodiment except that the pressure at the film forming time of the SiON film is held to be constant in a range of 0 to 50 mTorr (50 mTorr or more).

FIGS. 6A and 6B show the research result of the concentration distribution of each element in the depth direction of the SiON film in the MOS capacitors according to the comparative example and third embodiment. The concentration of each element in the SiON film was measured using SIMS.

As seen from FIG. 6A, for the nitrogen concentration distribution of the SiON film of the comparative example, only one maximal value of the nitrogen concentration exists in the vicinity of the surface. As seen from FIG. 6B, for the nitrogen concentration distribution of the SiON film of the present embodiment, in addition to the maximal value existing in the vicinity of the surface, the maximal value of the nitrogen concentration also exists in the vicinity of the interface with the silicon substrate 21.

Moreover, with respect to the respective MOS capacitors of the present embodiment and comparative example, the relation between the nitrogen concentration and electric film thickness in the SiON film was found to be similar to that of FIG. 3.

The reason for this is as follows. In the present embodiment, the method comprises doping nitrogen in the vicinity of the interface between the silicon substrate 21 and base oxide film 22 to form the first nitrided region $23_1$ having the maximal value of nitrogen concentration in the vicinity of the interface; and subsequently doping nitrogen in the vicinity of the surface of the base oxide film 22 to form the second nitrided region $23_2$ having the maximal value of the second nitrogen concentration in the vicinity of the surface.

The first nitrided region $23_1$ prevents the oxidation reaction of silicon in the vicinity of the interface between the silicon substrate 21 and base oxide film 22 at the nitriding process time of the base oxide film 22.

As a consequence, even when nitrogen is introduced into the base oxide film 22 at the high concentration, the physical film thickness of the SiON film 23 does not easily increase, and it is possible to reduce the electrical film thickness of the SiON film 23. That is, the SiON film 23 which has high nitrogen concentration and small physical and electric film thicknesses is obtained.

As described above, according to the present embodiment, without incurring any increase in the film thickness of the SiON film 23, the nitrogen concentration in the SiON film 23 can be raised. It is therefore possible to realize a fine MOS transistor which has a low leakage current.

The present embodiment can variously be modified as described hereinafter. For example, in the present embodiment, the pressure was changed in first and second stages at the film forming time of the SiON film 23, but another parameter may also be changed. Examples of this type of parameter include excitation power of the microwave, temperature of the substrate holding electrode for holding the substrate(substrate temperature), flow rate ratio of the rare gas and nitrogen, bias voltage applied to the substrate holding electrode, and the like. Two or more parameters can be changed at the film forming time of the SiON film 23. Furthermore, at the film forming time of the SiON film 23, at least one parameter can be changed twice or more times respectively.

In short, nitrogen is introduced in the interface portion between the silicon substrate 21 and base oxide film 22, and surface portion of the base oxide film 22 on the side opposite to the interface portion, and the maximal values of the nitrogen concentration can be obtained in the regions into which nitrogen are introduced. To achieve this, at least one parameter is changed at least once time.

A guideline of changing the parameter for realizing the maximal value of the nitrogen concentration described above is generally as follows. That is, the parameter is determined such that the kinetic energy of the nitrogen plasma (irradiation energy of the nitrogen ion) becomes high, and consequently, nitrogen can be introduced into the interface portion between the silicon substrate 21 and base oxide film 22. The parameter is determined such that the kinetic energy of the nitrogen plasma (irradiation energy of the nitrogen ion) becomes low, and consequently, nitrogen can be introduced into the surface portion of the base oxide film 22 on the side opposite to the interface portion.

Moreover, nitrogen can be introduced into the interface portion by heating the base oxide film in an atmosphere including NO and $N_2O$ at 800 to 900° C., instead of using plasma in the first stage at the film forming time.

Furthermore, in addition to the gate electrode, source of nitrogen, and substrate described in the present embodiment, those described in the first embodiment can be used.

(Fourth Embodiment)

FIGS. 7A to 7F are sectional views showing the manufacturing process of the MOS transistor according to a fourth embodiment of the present invention.

Figure 7A:
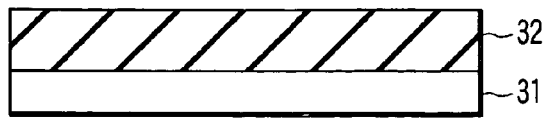
FIGS. 7A to 7F are sectional views showing the manufacturing process of the MOS transistor according to a fourth embodiment of the present invention.

First, as shown in FIG. 7A, the process comprises exposing a silicon substrate 31 to an oxidizing atmosphere of 900 to 1000° C.; and forming a thin silicon oxide film (base oxide film) 32 having a thickness of 1.2 to 1.4 nm on the surface of the silicon substrate 31.

Figure 7B:
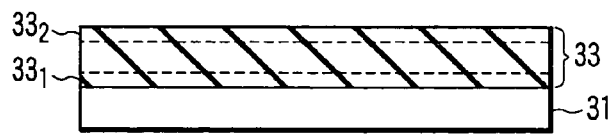

Next, the process comprises laying the silicon substrate 31, on which the base oxide film 32 is formed, on a substrate holding electrode which includes the heating mechanism in the vacuum chamber; setting the substrate holding electrode at a predetermined temperature; introducing the mixture gas of the rare gas and nitrogen ($N_2$) into the vacuum chamber to generate microwaves of 2.45 GHz; and generating the nitrogen plasma (nitrogen radical, nitrogen ion) using the microwaves. As a consequence, as shown in FIG. 7B, the base oxide film 32 is nitrided by the nitrogen plasma and an SiON film 33 which is to be processed into a gate insulating film is formed.

At this time, during the film forming process of the SiON film 33, first (in the first period), the pressure in the vacuum chamber is set to the constant low pressure in a range of 10 to 50 mTorr, and the kinetic energy of the nitrogen radicals (irradiation energy of the nitrogen ions) is raised. Thereafter (in the second period), the pressure is set to a high pressure of 50 mTorr or more, and the kinetic energy of the nitrogen radicals (irradiation energy of the nitrogen ions) is lowered.

By changing the pressure at the time of forming the SiON film 33 (kinetic energy of the nitrogen plasma (irradiation energy of the nitrogen ion)) in this manner, the nitrogen concentration distribution in the film thickness direction of the SiON film 23 has two maximal values.

Concretely, the SiON film 33 includes a first nitrided region $33_1$ indicating the maximal value of the first nitrogen concentration in the surface portion on the side in contact with the silicon substrate 31, and a second nitrided region $33_2$ indicating the maximal value of the second nitrogen concentration in the surface portion on the side opposite to the silicon substrate 31. The first nitrided region $33_1$ is formed mainly in the first period, and the second nitrided region $33_2$ is formed mainly in the second period.

The maximal value of the first nitrogen concentration is preferably smaller than that of the second nitrogen concentration for the same reason as that of the third embodiment.

Figure 7C:
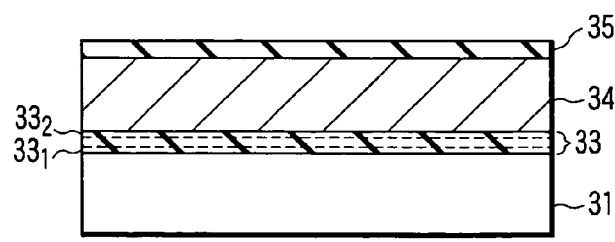

Next, as shown in FIG. 7C, a polycrystalline silicon film 34 including dopant which is to be processed into a gate electrode, and a silicon nitride film 35 as a gate upper dielectric film are successively formed on the SiON film 33.

Figure 7D:
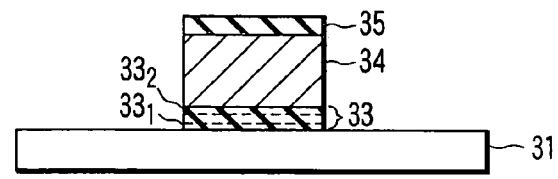

Next, as shown in FIG. 7D, the process comprises processing the silicon nitride film 35, polycrystalline silicon film 34, and SiON film 33 by the photolithography and etching to form the gate upper dielectric film 35 comprising the silicon nitride film, gate dielectric film 33 comprising the SiON film, and gate electrode 34 comprising the polycrystalline silicon film.

Figure 7E:
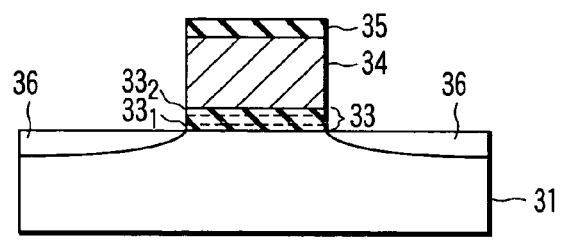

Next, as shown in FIG. 7E, dopant is implanted into the substrate surface by ion implantation method by using the gate upper dielectric film 35 as a mask. Thereafter, annealing is performed to form an extensions 36.

Figure 7F:
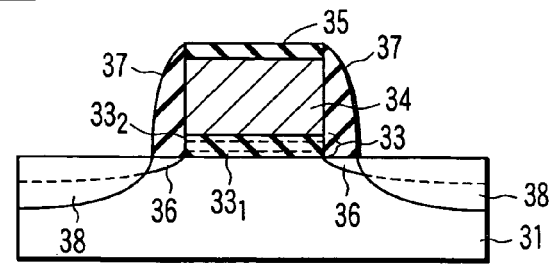

Next, as shown in FIG. 7F, the process comprises forming a gate side wall dielectric film 37 of the silicon nitride film; implanting dopant in the substrate surface by ion implantation method using the gate side wall dielectric film 37 and gate upper dielectric film 35 as a mask; and thereafter performing annealing to form a source/drain regions 38.

A research result of the concentration distribution of silicon, oxygen, and nitrogen in the SiON film 33 of the MOS transistor obtained in this manner, it is found out that the concentration distribution is similar to that of the SiON film 23 of the third embodiment. Furthermore, for the same reason as in the third embodiment, the nitrogen concentration in the SiON film 33 can be raised without incurring any increase in film thickness of the SiON film 33 It is therefore possible to realize a fine MOS transistor with a low gate leakage current.

Even in the present embodiment, the modification example similar to that of the third embodiment is possible. Moreover, when a metal gate electrode is used as the gate electrode, an application of damascene gate structure further enhances miniaturization of the structure.

In the above-described embodiments, the present invention applied to the capacitor dielectric film of the MOS capacitor or the gate dielectric film of the MOS transistor has been described, but the present invention can also be applied to a thin dielectric film for use in elements other than the above-described elements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A method of manufacturing a semiconductor device comprising:
    forming a silicon oxide film on a semiconductor region including silicon;
    heating the semiconductor region and silicon oxide film in a helium gas atmosphere, said atmosphere not including a helium plasma; and
    forming an insulating film including silicon, oxygen, nitrogen, and helium by nitriding the silicon oxide film.

2. The method of manufacturing the semiconductor device according to claim 1, wherein heating the semiconductor region and the silicon oxide film in the helium atmosphere is performed so that helium is introduced into an interface portion between the semiconductor region and the silicon oxide film.

3. The method of manufacturing the semiconductor device according to claim 1, wherein the silicon oxide film is nitrided by a plasma of a material including nitrogen.

4. The method of manufacturing the semiconductor device according to claim 1, wherein a film thickness of the silicon oxide film is not more than 2.5 nm.

5. The method of manufacturing the semiconductor device according to claim 1, wherein a film thickness of the silicon oxide film is not more than 1.4 nm.

* * * * *